US009253907B2

(12) United States Patent
Mao et al.

(10) Patent No.: US 9,253,907 B2
(45) Date of Patent: Feb. 2, 2016

(54) PANEL HAVING POSITIONING FUNCTION AND RELATED ELECTRONIC DEVICE

(71) Applicant: Wistron Corporation, New Taipei (TW)

(72) Inventors: Zhong-hui Mao, New Taipei (TW); Dong-Ying Chen, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 0 days.

(21) Appl. No.: 13/794,855

(22) Filed: Mar. 12, 2013

(65) Prior Publication Data

US 2013/0314856 A1 Nov. 28, 2013

(30) Foreign Application Priority Data

May 22, 2012 (CN) .......................... 2012 1 0161207

(51) Int. Cl.
*H05K 5/03* (2006.01)
*B65D 51/00* (2006.01)
*H05K 5/02* (2006.01)

(52) U.S. Cl.
CPC *H05K 5/03* (2013.01); *B65D 51/00* (2013.01); *H05K 5/0239* (2013.01)

(58) Field of Classification Search
CPC ......... G06F 1/181; G06F 1/182; G06F 1/183; G06F 1/16; G06F 1/1656; G06F 1/1679; H05K 5/00; H05K 5/0013; H05K 5/0004; H05K 5/03; H05K 5/0208
USPC .......................... 312/223.2, 265.5, 265.6, 213
See application file for complete search history.

(56) References Cited

U.S. PATENT DOCUMENTS

| 4,270,820 | A | * | 6/1981 | McMullan et al. | ........... 312/242 |
| 5,114,036 | A | * | 5/1992 | Liu | ................................ 220/787 |
| 5,248,193 | A | * | 9/1993 | Schlemmer | ................ 312/223.2 |
| 5,397,176 | A | * | 3/1995 | Allen et al. | ................. 312/223.2 |
| 5,527,104 | A | * | 6/1996 | Moss | .............................. 312/264 |
| 5,542,757 | A | * | 8/1996 | Chang | ......................... 312/223.2 |
| 6,120,116 | A | * | 9/2000 | Phillips | ...................... 312/223.2 |
| 6,172,869 | B1 | * | 1/2001 | Hood et al. | ............... 361/679.27 |

(Continued)

FOREIGN PATENT DOCUMENTS

TW M314357 6/2007
TW 201002174 1/2010

OTHER PUBLICATIONS

Office action mailed on Oct. 28, 2014 for the Taiwan application No. 101119269, filing date May 30, 2012, p. 1 line 14, p. 2~3 and p. 4 line 1~24.

(Continued)

*Primary Examiner* — Andrew Rosersma
(74) *Attorney, Agent, or Firm* — Winston Hsu; Scott Margo

(57) ABSTRACT

A panel having positioning function includes a body covering an opening on an extrusion casing, and a positioning mechanism having at least one position set. The position set includes a first rib disposed on a first side of the body, a first contact portion disposed on the first rib and contacting against an inner surface of the extrusion casing, a second rib disposed on a second side of the body, and a second contact portion disposed on the second rib and contacting against the other inner surface of the extrusion casing. A position of the second rib on the second side is symmetrized to a position of the first rib on the first side, so that the panel can align with the extrusion casing due to deformation of the position set.

18 Claims, 14 Drawing Sheets

(56) References Cited

U.S. PATENT DOCUMENTS

| | | | |
|---|---|---|---|
| 6,550,877 B1* | 4/2003 | Anderson et al. | 312/223.2 |
| 6,654,256 B2* | 11/2003 | Gough | 361/816 |
| 6,903,937 B2* | 6/2005 | Watanabe | 361/752 |
| 7,208,686 B1* | 4/2007 | Chen et al. | 174/561 |
| 7,924,576 B2 | 4/2011 | Tang | |
| 2004/0227436 A1* | 11/2004 | Felske et al. | 312/265.5 |
| 2006/0158070 A1* | 7/2006 | Woods et al. | 312/223.2 |
| 2008/0084146 A1* | 4/2008 | Wang | 312/223.2 |

OTHER PUBLICATIONS

Office action mailed on Aug. 19, 2015 for the China application No. 201210161207.8, p. 3 line 5-40, p. 4-6 and p. 7 line 1-17.

* cited by examiner

PANEL HAVING POSITIONING FUNCTION AND RELATED ELECTRONIC DEVICE

BACKGROUND OF THE INVENTION

1. Field of the Invention

The present invention relates to an electronic device including a casing and a panel, and more particularly, to a panel having positioning function, so that the panel can automatically align with the casing to form an artistic electronic device.

2. Description of the Prior Art

A conventional apparatus, such as a server, includes a metal casing, a plurality of electronic components and a plastic panel. The plurality of electronic components is disposed inside the metal casing, and the plastic panel covers an opening on the metal casing for preventing dust from falling. The plastic panel is disposed on the metal casing in a detachable manner, so a user can disassemble the plastic panel from the metal casing to replace and to repair the electronic components. Generally, the conventional metal casing is made by metal pressing technology, and can provide preferred contour stability. A plurality of holes is formed on the metal casing. When the plastic panel is disposed on the metal casing, a positioning bolt of the plastic panel inserts into the hole to fix the plastic panel on the metal casing.

For decreasing manufacturing cost and advancing aesthetic of the product, the metal casing can be further made by metal extruding technology, such as aluminum extrusion casing. However, dimensional variation of the metal casing made by the extruding technology is unstable, and a contour of the extrusion casing is varied and difficult to match dimensions of the panel, so the conventional positioning bolt and the conventional hole can not be utilized to fix the panel on the extrusion casing. For example, please refer to FIG. 14. FIG. 14 is a diagram of an apparatus 50 in the prior art. The apparatus 50 includes an aluminum extrusion casing 52 and a plastic panel 54. The contour of the casing 52 does not perfectly match dimensions of the panel 54 due to the metal extruding technology. A body of the panel 54 is compressed by the conventional positioning mechanism, which can not be applied to the metal extrusion casing for aligning with the casing 52. A gap is formed between the casing 52 and the panel 54, and aesthetic of the apparatus 50 is decreased. Therefore, design of an positioning mechanism which can overcome the above-mentioned drawbacks and is suitable for assembling components with unmatched dimensions is an important issue in the mechanism industry.

SUMMARY OF THE INVENTION

The present invention provides a panel having positioning function, so that the panel can automatically align with the casing to form an artistic electronic device for solving above drawbacks.

According to the claimed invention, a panel includes a body and a positioning mechanism. The body covers an opening on an extrusion casing. The body includes a first side, a second side, a third side and a fourth side. The first side is substantially parallel to the second side, and the third side is substantially parallel to the fourth side. The positioning mechanism includes at least one position set disposed on the body. The position set includes a first rib, a first contact portion, a second rib and a second contact portion. The first rib is disposed on the first side of the body. The first contact portion is disposed on the first rib and contacts against a first inner surface of the extrusion casing in a deformable manner. The second rib is disposed on the second side of the body opposite to the first side, and a position of the second rib on the second side is symmetrized to a position of the first rib on the first side. The second contact portion is disposed on the second rib and contacts against a second inner surface of the extrusion casing opposite to the first inner surface in the deformable manner, so that the panel aligns with a boundary of the extrusion casing via deformation of the position set. The position set is deformed when the panel is assembled with the extrusion casing, a deformation value of a combination of the first contact portion and the first rib is constant, and a deformation value of a combination of the second contact portion and the second rib is constant when the body substantially aligns with the opening.

According to the claimed invention, the first contact portion is an inclined front part of the first rib.

According to the claimed invention, the first contact portion is a protrusion disposed on a front part of the first rib.

According to the claimed invention, the position set further includes a lead angle portion disposed on a surface of the protrusion.

According to the claimed invention, the first rib and the second rib are made of resilient material.

According to the claimed invention, an interference value of the first contact portion relative to the extrusion casing is substantially greater than an amount of dimensional variations of the extrusion casing and the panel.

According to the claimed invention, the first rib does not contact the first inner surface of the extrusion casing.

According to the claimed invention, the positioning mechanism further includes two position sets. The two position sets are respectively disposed on the first side and the second side, or disposed on the third side and the fourth side.

According to the claimed invention, the positioning mechanism further comprises two position sets. The two position sets are respectively disposed on the first side and the third side, or disposed on the first side and the fourth side, or disposed on the second side and the third side, or disposed on the second side and the fourth side.

According to the claimed invention, the panel further includes a through-hole structure disposed on the body. A diameter of the through-hole structure is substantially greater than a diameter of an external fixing component. The external fixing component pierces into the through-hole structure without contacting an inner wall of the diameter of the through-hole structure so as to fix a boss of the extrusion casing.

According to the claimed invention, an electronic device includes an extrusion casing and a casing. The extrusion casing includes a first inner surface and a second inner surface. An opening is formed on a side of the extrusion casing. The first inner surface and the second inner surface are respectively located by two sides of the opening. The panel is disposed on the extrusion casing. The panel includes a body and a positioning mechanism. The body covers the opening on the extrusion casing. The body includes a first side, a second side, a third side and a fourth side. The first side is substantially parallel to the second side, and the third side is substantially parallel to the fourth side. The positioning mechanism includes at least one position set disposed on the body. The position set includes a first rib, a first contact portion, a second rib and a second contact portion. The first rib is disposed on the first side of the body. The first contact portion is disposed on the first rib and contacts against a first inner surface of the extrusion casing in a deformable manner. The second rib is disposed on the second side of the body opposite to the first side, and a position of the second rib on the second side is symmetrized to a position of the first rib on the first side. The second contact portion is disposed on the second rib and contacts against a second inner surface of the extrusion casing opposite to the first inner surface in the deformable manner, so that the panel aligns with a boundary of the extrusion casing via deformation of the position set. The position set is deformed when the panel is assembled with the extrusion casing, a deformation value of a combination of the first contact portion and the first rib is constant, and a deformation value of a combination of the second contact portion and the second rib is constant when the body substantially aligns with the opening.

The present invention effectively overcomes drawbacks of uneven contour of the metal casing generated by the extruding procedures. The positioning mechanism of the present invention utilizes dynamic balance to align the panel with the extrusion casing automatically, and has advantages of simple structure, easy assembly and positioning function. Therefore, the panel having the positioning function of the present invention can accurately align the extrusion casing even through the contour dimensions of the extrusion casing can not be manufactured as predetermined values due to parameter variation of the extruding procedures, so as to fabricate the electronic device with the metal texture and preferable structural alignment.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
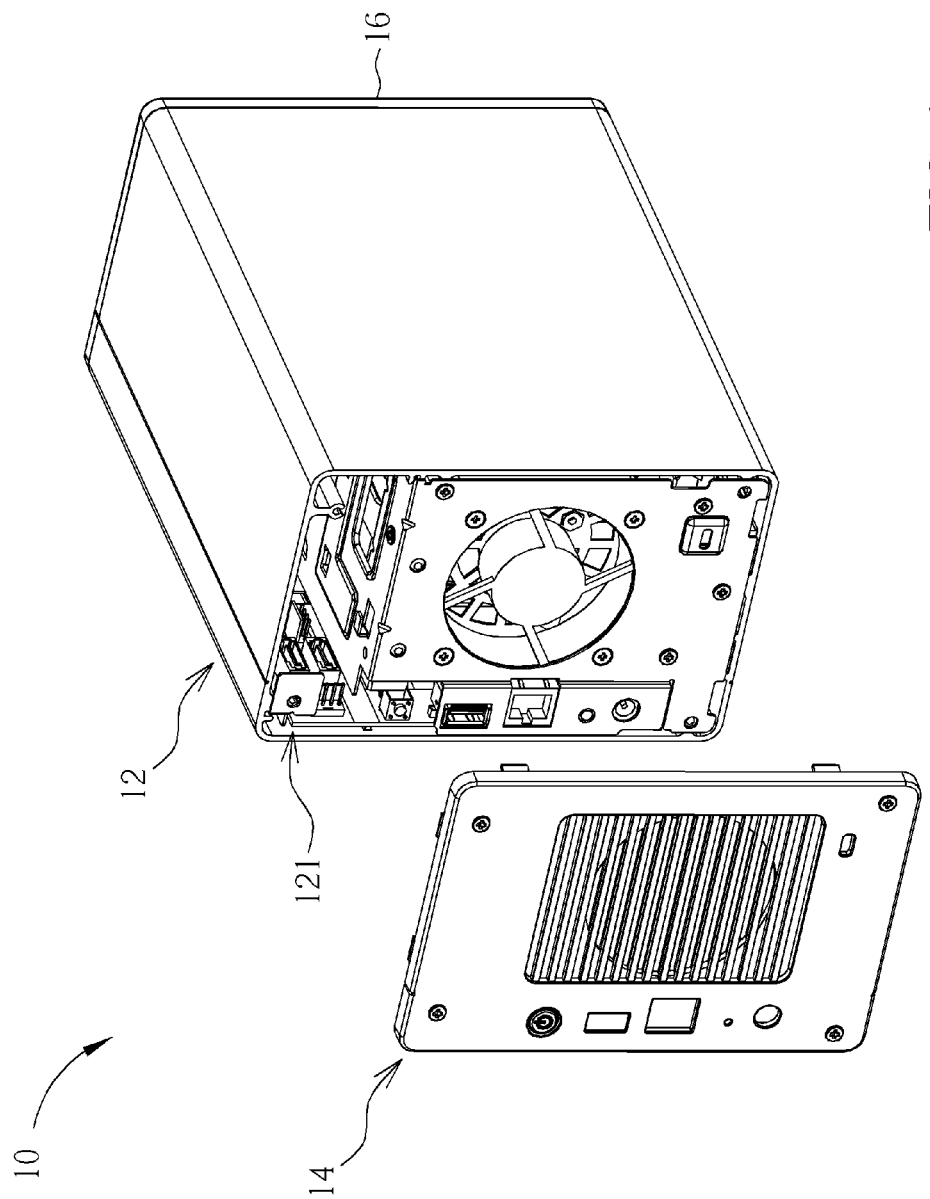
FIG. 1 is an exploded diagram of an electronic device according to a first embodiment of the present invention.
Figure 2:
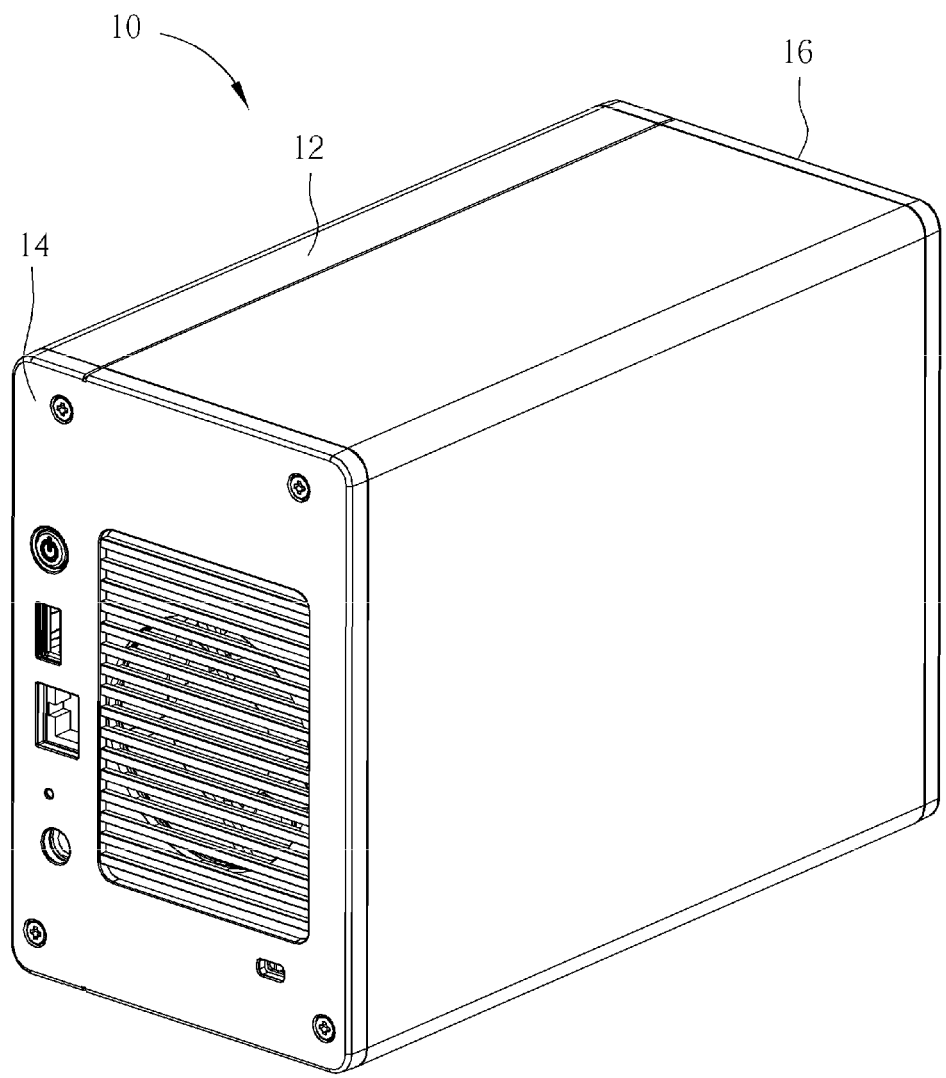
FIG. 2 is an assembly diagram of the electronic device according to the first embodiment of the present invention.

Please refer to FIG. 1 and FIG. 2. FIG. 1 is an exploded diagram of an electronic device 10 according to a first embodiment of the present invention. FIG. 2 is an assembly diagram of the electronic device 10 according to the first embodiment of the present invention. The electronic device 10 includes an extrusion casing 12 and a panel 14. A blank casing is a hollow long sleeve with a predetermined section, and the blank casing is cut to manufacture the extrusion casing 12. Generally, the extrusion casing 12 can be made of aluminum material, which means the extrusion casing 12 is an aluminum extrusion model. The aluminum extrusion model has preferred artistic appearance, such as metal texture. The aluminum extrusion model further has advantages of simple processing procedures to effectively decrease manufacturing cost of the electronic device 10. A specific property of the aluminum extrusion model is that dimensional variation of section contour is varied according to parameters of the processing procedures (extruding procedures), so the panel 14 of the present invention has positioning function, to perfectly match the extrusion casing 12 whose section contour is unstable due to the extruding procedures.

Figure 3:
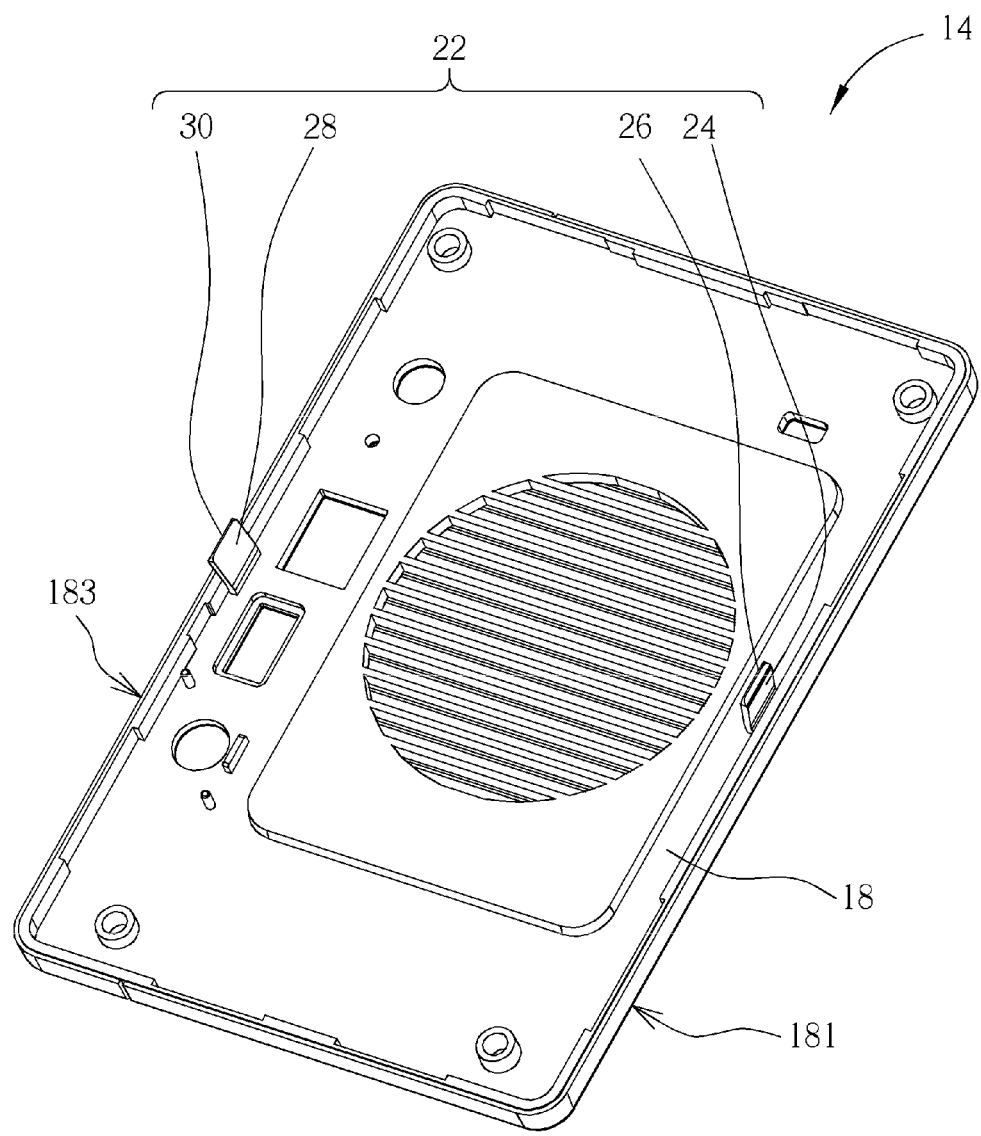
FIG. 3 is a diagram of a panel in another view according to the first embodiment of the present invention.

An opening 121 is formed on a side of the extrusion casing 12. A plurality of electronic components, such as a processor, a hard disk, a fan, a circuit board and so on, can be accommodated inside the extrusion casing 12. The electronic device 10 further includes a front cover 16 disposed on the other side, which is opposite to the opening 121, of the extrusion casing 12. The panel 14 of the present invention not only has the positioning function when assembling, but also can be disposed on the extrusion casing 12 in a detachable manner, so that the electronic components inside the extrusion casing 12 can be replaced and repaired conveniently. Please refer to FIG. 3. FIG. 3 is a diagram of the panel 14 in another view according to the first embodiment of the present invention. The panel 14 includes a body 18 and a positioning mechanism 20. The body 18 covers the opening 121 to prevent dust from falling into the extrusion casing 12. The positioning mechanism 20 includes at least one position set 22, and the panel 14 can utilize the position set 22 to uniformly apply force on two opposite inner surfaces of the extrusion casing 12 for an aim of the positioning function.

Figure 4:
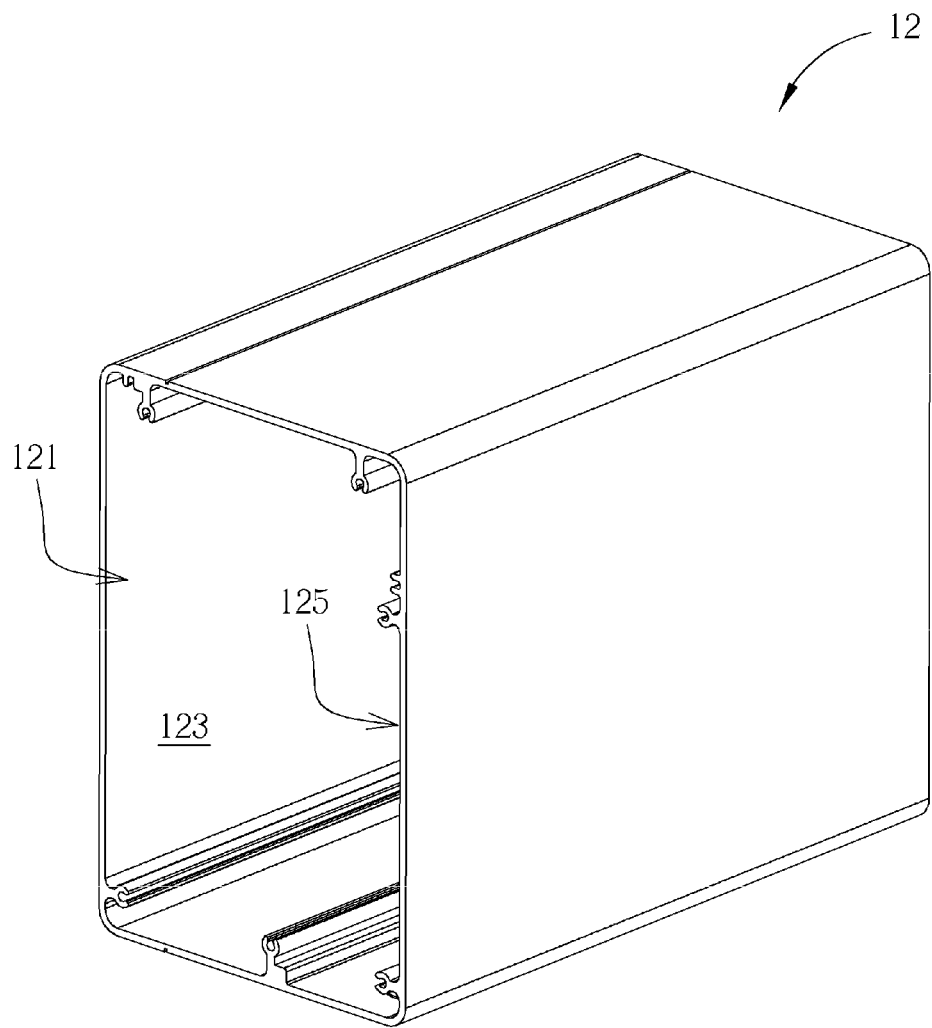
FIG. 4 is a diagram of an extrusion casing according to the first embodiment of the present invention.

Please refer to FIG. 3 and FIG. 4. FIG. 4 is a diagram of the extrusion casing 12 according to the first embodiment of the present invention. The position set 22 is disposed on the body 18. The body 18 includes a first side 181 and a second side 183. The second side 183 is opposite to and substantially parallel to the first side 181, so the first side 181 and the second side 183 are in symmetry. The position set 22 includes a first rib 24, a first contact portion 26, a second rib 28 and a second contact portion 30. The first rib 24 and the second rib 28 are respectively disposed on the first side 181 and the second side 183 of the body 18 in a face-to-face manner. The first contact portion 26 is disposed on the first rib 24, and the second contact portion 30 is disposed on the second rib 28. When the panel 14 covers the opening 121 on the extrusion casing 12, the first contact portion 26 and the second contact portion 30 respectively contact against a first inner surface 123 and a second inner surface 125 of the extrusion casing 12 in a deformable manner. The first inner surface 123 and the second inner surface 125 are respectively located by two sides of the opening 121.

Because the first rib 24 and the second rib 28 are respectively disposed on two opposite sides of the body 18 in symmetric, a structural shape of an assembly of the first rib 24 and the first contact portion 26 is substantially identical to a structural shape of an assembly of the second rib 28 and the second contact portion 30, so that an action force from the first contact portion 26 to the first inner surface 123 can be substantially equal to an action force from the second contact portion 30 to the second inner surface 125 for balance. Therefore, the panel 14 can be automatically adjusted to a correct position by the action forces from the position set 22 to the extrusion casing 12, and the panel 14 can align with a boundary of the extrusion casing 12 for completely covering the opening 121.

As shown in FIG. 3, the first contact portion 26 can be an inclined front part of the first rib 24. The first rib 24 of the first embodiment can protrude from a surface of the body 18, and obliquely stretch toward structural outside of the panel 14. When the panel 14 is assembled with the extrusion casing 12, the front part (the first contact portion 26) of the first rib 24 can contact the first inner surface 123, and the first rib 24 does not contact the extrusion casing 12 and the first inner surface 123, so as to prevent the body 18 of the panel 12 from falling into the opening 121. In addition, the first rib 24 and the second rib 28 can be made of resilient material. As the first contact portion 26 contacts against the first inner surface 123 of the extrusion casing 12, a reaction force can be applied by the extrusion casing 12 to bend the first rib 24 in a resiliently deformable manner. Working principle of the assembly of the second rib 28 and the second contact portion 30 equals the assembly of the first rib 24 and the first contact portion 26, a position of the panel 14 relative to the extrusion casing 12 can be automatically adjusted by the positioning mechanism 20 with the symmetric position set 22, so as to achieve the aim of the positioning function.

Figure 5:
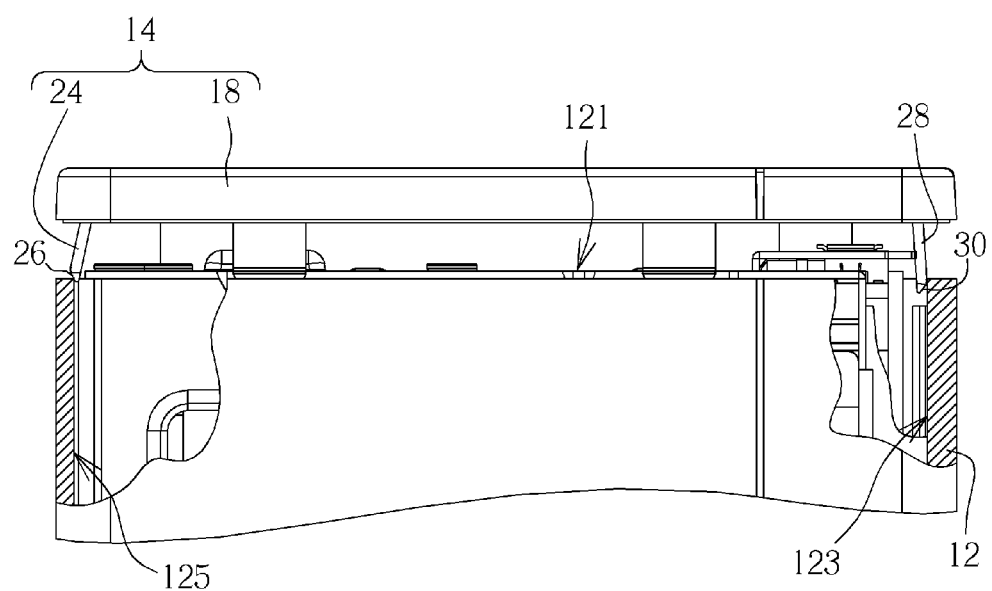
FIG. 5 is a sectional view of the electronic device according to the first embodiment of the present invention.

Please refer to FIG. 5. FIG. 5 is a sectional view of the electronic device 10 according to the first embodiment of the present invention. As shown in FIG. 5, a left side and a right side of the extrusion casing 12 have different thickness, which means extruding tolerance of the extrusion casing 12 is greater than a casing made by metal pressing technology. When the panel 14 is assembled with the extrusion casing 12, the first inner surface 123 and the second inner surface 125 of the extrusion casing 12 can respectively apply the reaction force to the first contact portion 26 and the second contact portion 30 of the panel 14. Due to different thickness of the extrusion casing 12, a deformation value of the combination of the first contact portion 26 and the first rib 24 is not identical to a deformation value of the combination of the second contact portion 30 and the second rib 28. For example, the deformation value of the second contact portion 30 and the second rib 28, which corresponds to a large side (the right side) of the extrusion casing 12, can be substantially greater than the deformation value of the first contact portion 26 and the first rib 24, which corresponds to a small side (the left side) of the extrusion casing 12. According to the balance between the extrusion casing 12 and the panel 14, the deformation value of the first rib 24, the first contact portion 26, the second rib 28 and the second contact portion 30 are respectively constant to one another, so the body 18 can be automatically adjusted at a centred position to accurately align with the opening 121.

Figure 6:
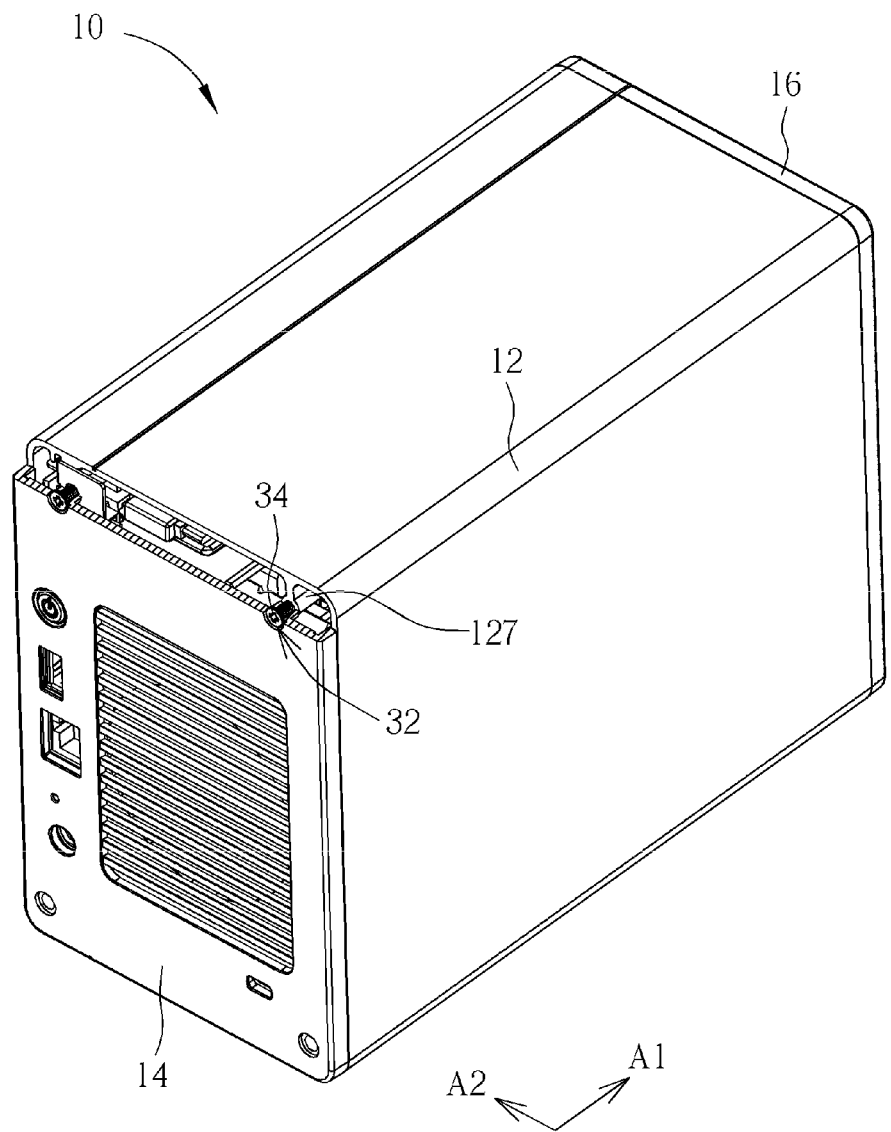
FIG. 6 and FIG. 7 respectively are sectional views of the electronic device in different view angles according to the first embodiment of the present invention.
Figure 7:
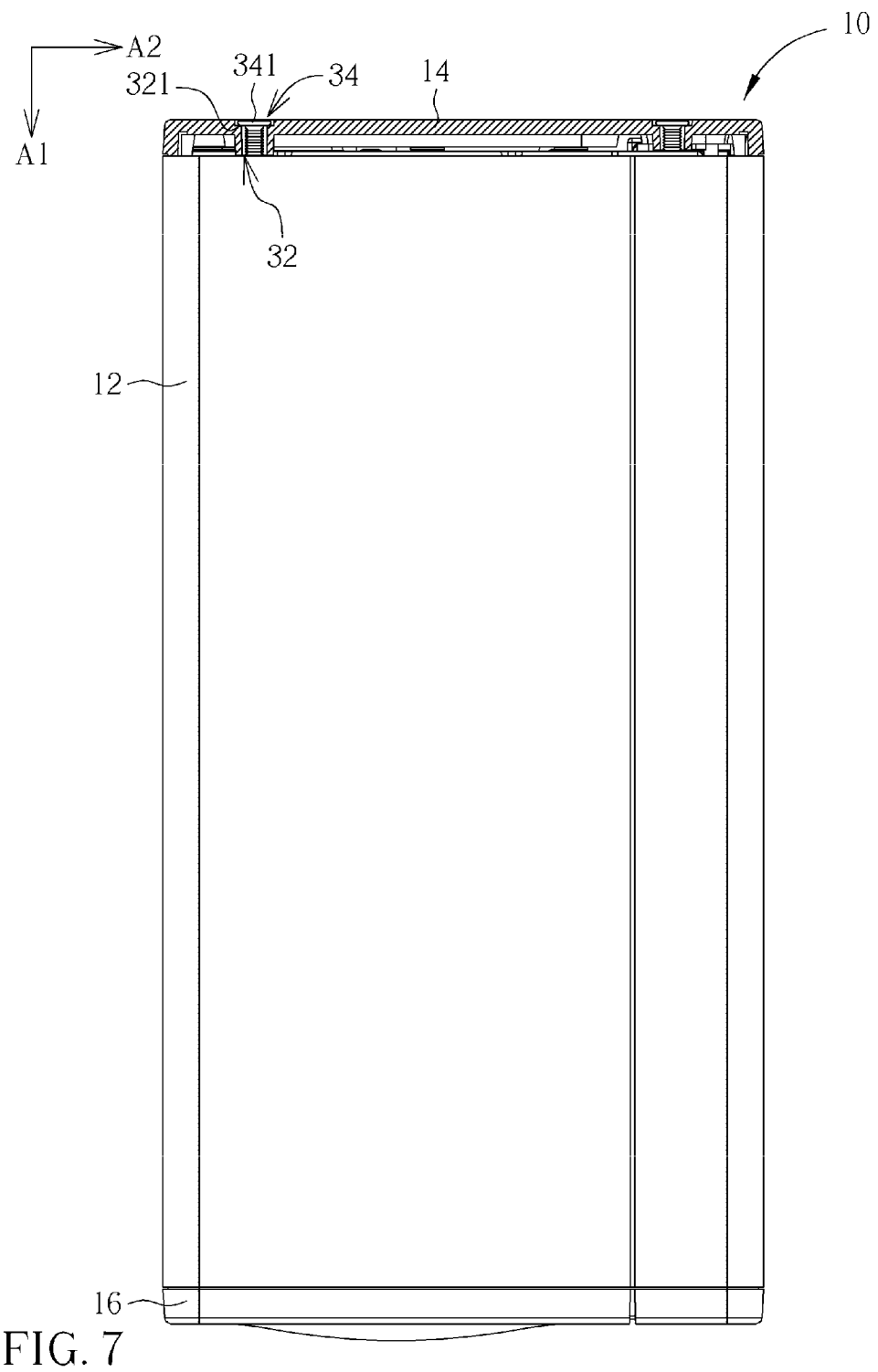

Please refer to FIG. 6 and FIG. 7. FIG. 6 and FIG. 7 respectively are sectional views of the electronic device 10 in different view angles according to the first embodiment of the present invention. The panel 14 can further include a through-hole structure 32 disposed on the body 18. As shown in FIG. 7, a diameter of the through-hole structure 32 can be substantially greater than a diameter of an external fixing component 34. The external fixing component 34 can be a screw or a bolt. The external fixing component 34 does not contact an inner wall of the diameter of the through-hole structure 32 when piercing into the through-hole structure 32 to fix a boss 127 of the extrusion casing 12. As shown in FIG. 6, a head 341 of the external fixing component 34 contacts against a stop 321 of the through-hole structure 32 for constraint. Therefore, the reaction force is generated by the extrusion casing 12 to the positioning mechanism 20 of the panel 14 when the panel 14 is assembled with the extrusion casing 12, so that design of the through-hole structure 32 can effectively prevent the external fixing component 34 from damaging alignment of the extrusion casing 12 and the panel 14.

It is to say, the fixing component 34 can apply force to the extrusion casing 12 along an axial direction A1 when the fixing component 34 is locked at the boss 127, so as to constrain a movement of the panel 14 relative to the extrusion casing 12 along the axial direction A1. In addition, the fixing component 34 does not contact the other components along a radial direction A2 different from the axial direction A1 due to the through-hole structure 32, so the action force applied to the panel 14 along the radial direction A2 is generated by the position set 22 (not shown in FIG. 6 and FIG. 7). The balance of the position set 22 is not damaged when the fixing component 34 is locked into the panel 14, and the panel 14 can stably keep its alignment for the extrusion casing 12.

Figure 8:
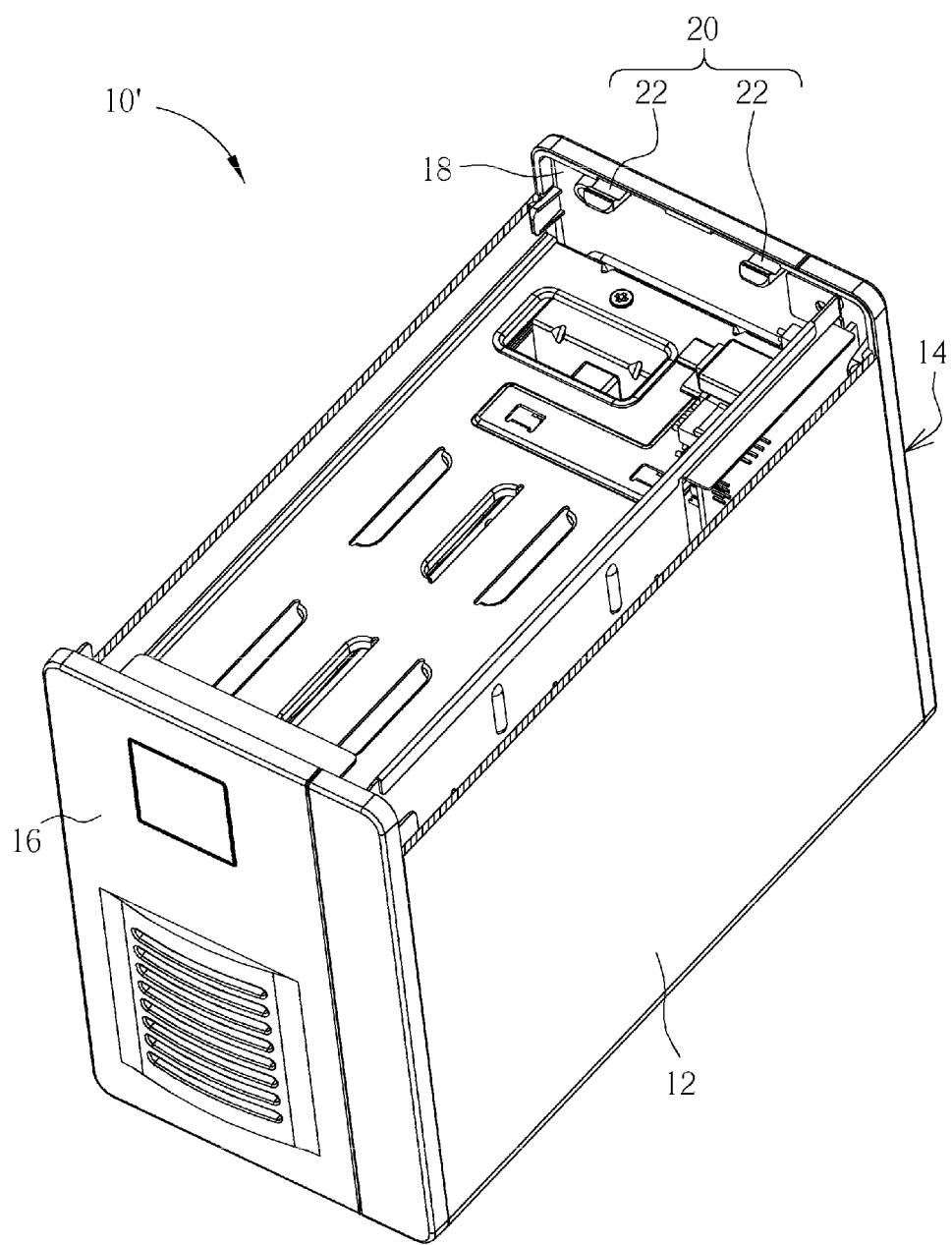
FIG. 8 is a diagram of an electronic device according to a second embodiment of the present invention.
Figure 9:
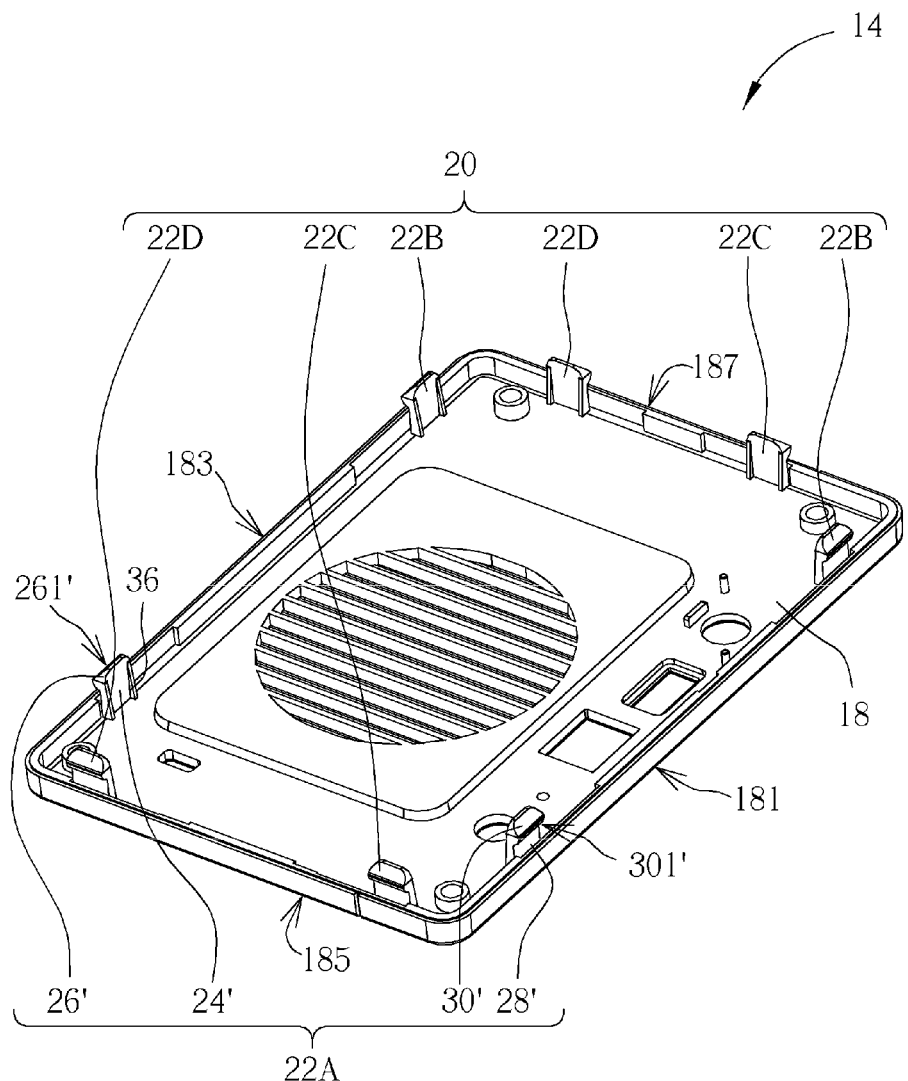
FIG. 9 is a diagram of the panel according to the second embodiment of the present invention.

Please refer to FIG. 8 and FIG. 9. FIG. 8 is a diagram of an electronic device 10' according to a second embodiment of the present invention. FIG. 9 is a diagram of the panel 14 according to the second embodiment of the present invention. In the second embodiment, elements having the same numerals as ones of the first embodiment have the same structures and functions, and detailed description is omitted for simplicity. Difference between the first embodiment and the second embodiment is that the first rib 24' and the second rib 28' of the panel 14 of the second embodiment can be erect components connected to the body 18, and the first contact portion 26' and the second contact portion 28' can be protrusions respectively disposed on the first rib 24' and the second rib 28', as shown in FIG. 9. A lead angle portion 261' (or 301') disposed on a surface of the protrusion can be utilized to guide the positioning mechanism 20 into the extrusion casing 12. Function of the lead angle portion is the same as the inclined front part of the first embodiment, and detailed description is omitted for simplicity.

When the panel 14 is assembled with the extrusion casing 12, the first contact portion 26' and the second contact portion 30' can respectively contact against the first inner surface 123 and the second inner surface 125 of the extrusion casing 12. The first rib 24' and the second rib 28' can be bent by the reaction force from the extrusion casing 12, so as to adjust the balance between the ribs and the extrusion casing 12. After the applied force between the first rib 24', the second rib 28' and the extrusion casing 12 is balanced, the panel 14 can automatically align with the opening 121 on the extrusion casing 12 by the alignment of the positioning mechanism 20. Furthermore, the first rib 24' (or the second rib 28') can further include a rib structure 36 disposed on a side adjacent to the first contact portion 26', so as to provide supporting force to prevent the first rib 24' from excessive bending.

It should be mentioned that the positioning mechanism 20 of the panel 14 of the second embodiment can include a plurality of position sets 22, and the position sets 22 are disposed on sides of the body 18 in symmetric. The body 18 further includes a third side 185 and a fourth side 187, and the third side 185 is substantially parallel to the fourth side 187. For example, the position sets 22A and 22B can be respectively disposed on the first side 181 and the second side 183 of the body 18, distances of the position sets 22A and 22B relative to the third side 185 and relative to the fourth side 187 are substantially constant. The position sets 22C and 22D can be respectively disposed on the third side 185 and the fourth side 187 of the body 18, distances of the positions sets 22C and 22D relative to the first side 181 and relative to the second side 183 are substantially constant. As shown in FIG. 9, the position sets 22A, 22B, 22C and 22D of the positioning mechanism 20 have the same structures and dimensions, and are disposed on four sides of the body 18 accordingly. Thus, when the panel 14 is assembled with the extrusion casing 12, the reaction forces can be respectively applied from four inner surfaces of the extrusion casing 12 to the corresponding position sets 22A, 22B, 22C and 22D. The position set 22 can balance the reaction force from the extrusion casing 12 by the resiliently deformable function, so the body 18 of the panel 14 can align with the extrusion casing 12 automatically.

Figure 10:
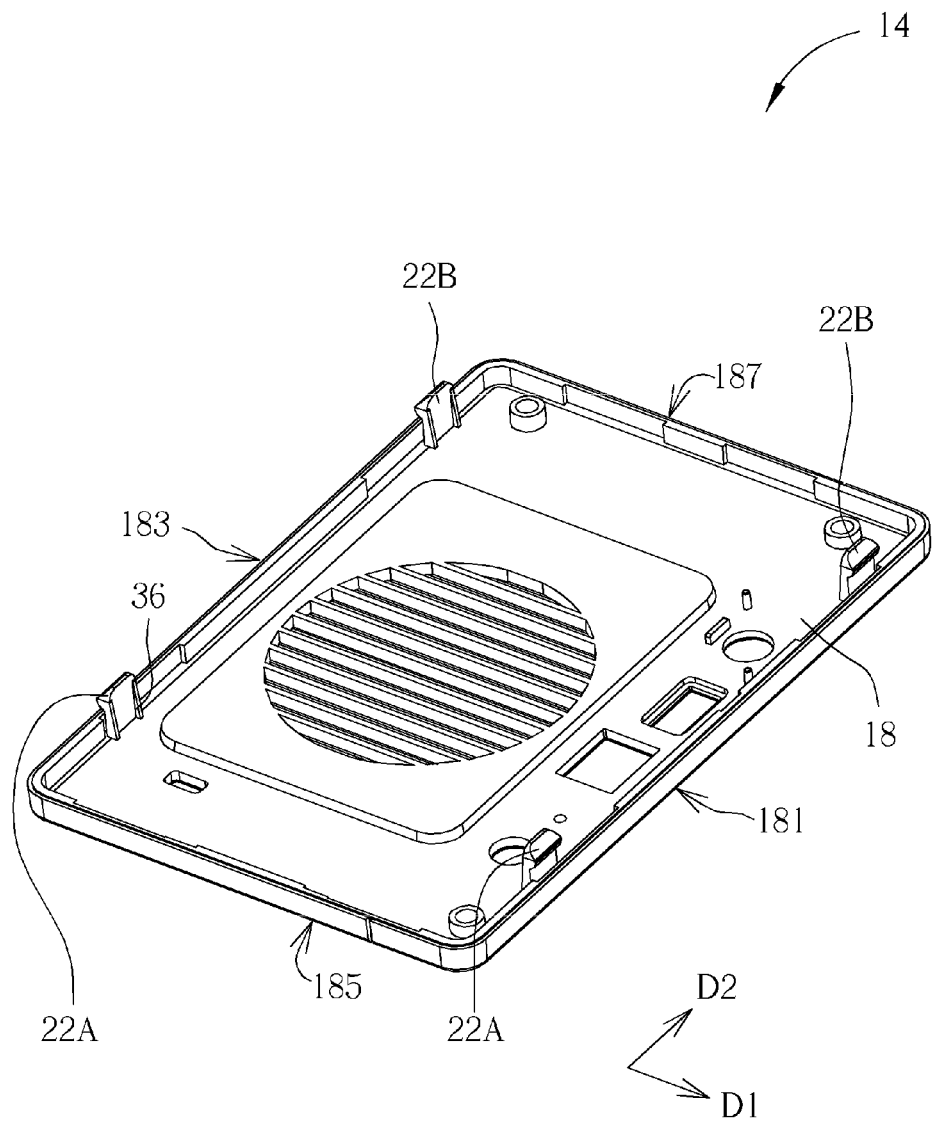
FIG. 10 and FIG. 11 respectively are diagrams of the panel according to the other embodiments of the present invention.
Figure 11:
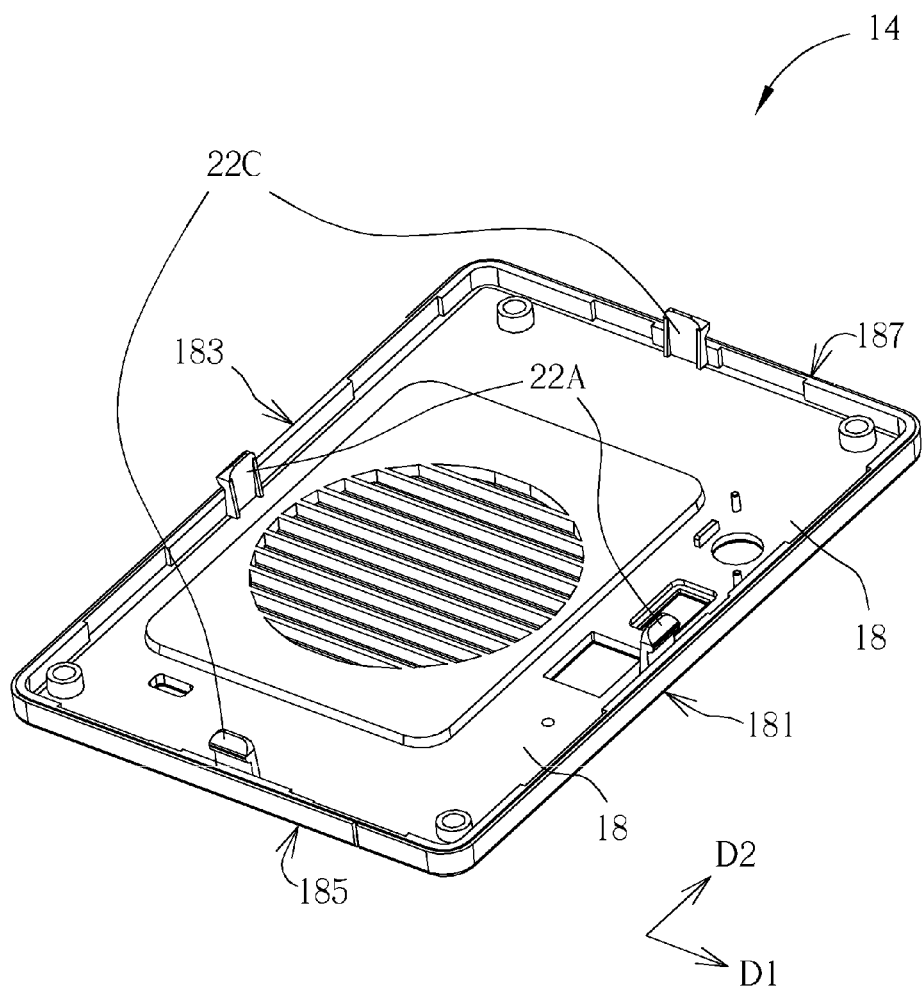

Please refer to FIG. 10 and FIG. 11. FIG. 10 and FIG. 11 respectively are diagrams of the panel 14 according to the other embodiments of the present invention. As shown in FIG. 10, the positioning mechanism 20 of the panel 14 can include the position sets 22A and 22B respectively disposed on the first side 181 and the second side 183 of the body 18 in the same direction. Arrangement of the position sets 22A and 22B are symmetric respectively on the first side 181 and the second side 183, so that the body 18 of the panel 14 can align with the opening 121 along a first direction D1. Arrangement of the position sets 22A and 22B are symmetric respectively on the third side 185 and the fourth side 187, so that the body 18 can further align with the opening 121 along a second direction D2 accordingly. Because the second direction D2 is substantially perpendicular to the first direction D1, the panel 14 can automatically align with the extrusion casing 12. Furthermore, the positioning mechanism 20 can further dispose the plurality of position sets 22 on the third side 185 and the fourth side 187 of the body 18, its disposition is the same as the embodiment shown in FIG. 10, and detailed description is omitted herein for simplicity.

As shown in FIG. 11, the positioning mechanism 20 of the panel 14 can include the position sets 22A and 22C respectively disposed on the sides of the body 18 in different directions. For example, the position set 22A can be disposed on the first side 181 and the second side 183, and the position set 22C can be disposed on the third side 185 and the fourth side 187. The body 18 can align with the opening 121 along the first direction D1 by the position set 22A. There is one position set 22 disposed on the first side 181 and the second side 183, so the body 18 can not align with the opening 121 along the second direction D2 by the position set 22A, therefore, the body 18 further utilizes the position set 22C to align with the opening 121 along the second direction D2, and the panel 14 can have preferable positioning function. An amount and disposition of the position sets 22 of the positioning mechanism 20 are not limited to the above-mentioned embodiment, and depend on design demand.

Figure 12:
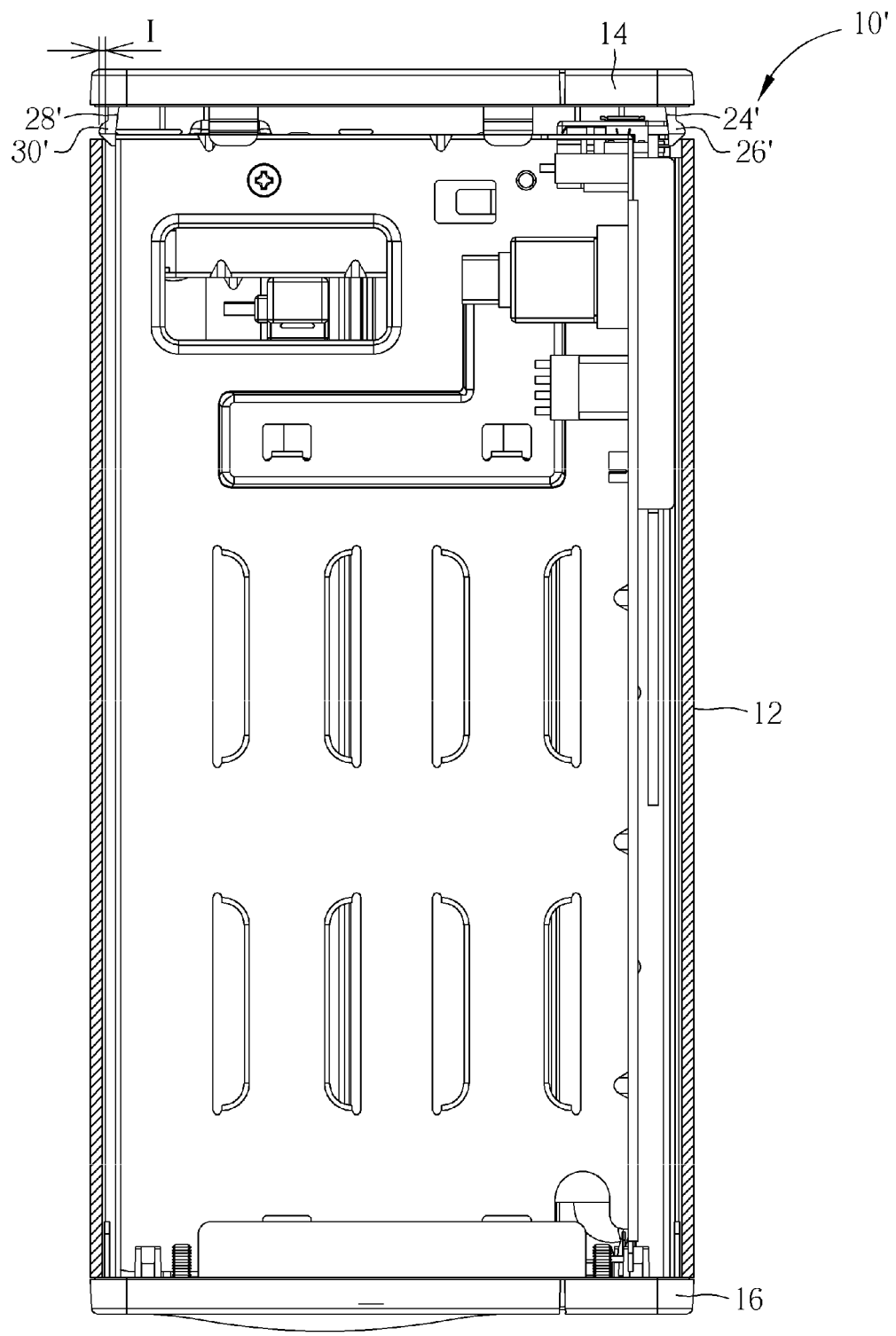
FIG. 12 and FIG. 13 respectively are diagrams of the electronic device in different assembly steps according to the second embodiment of the present invention.
Figure 13:
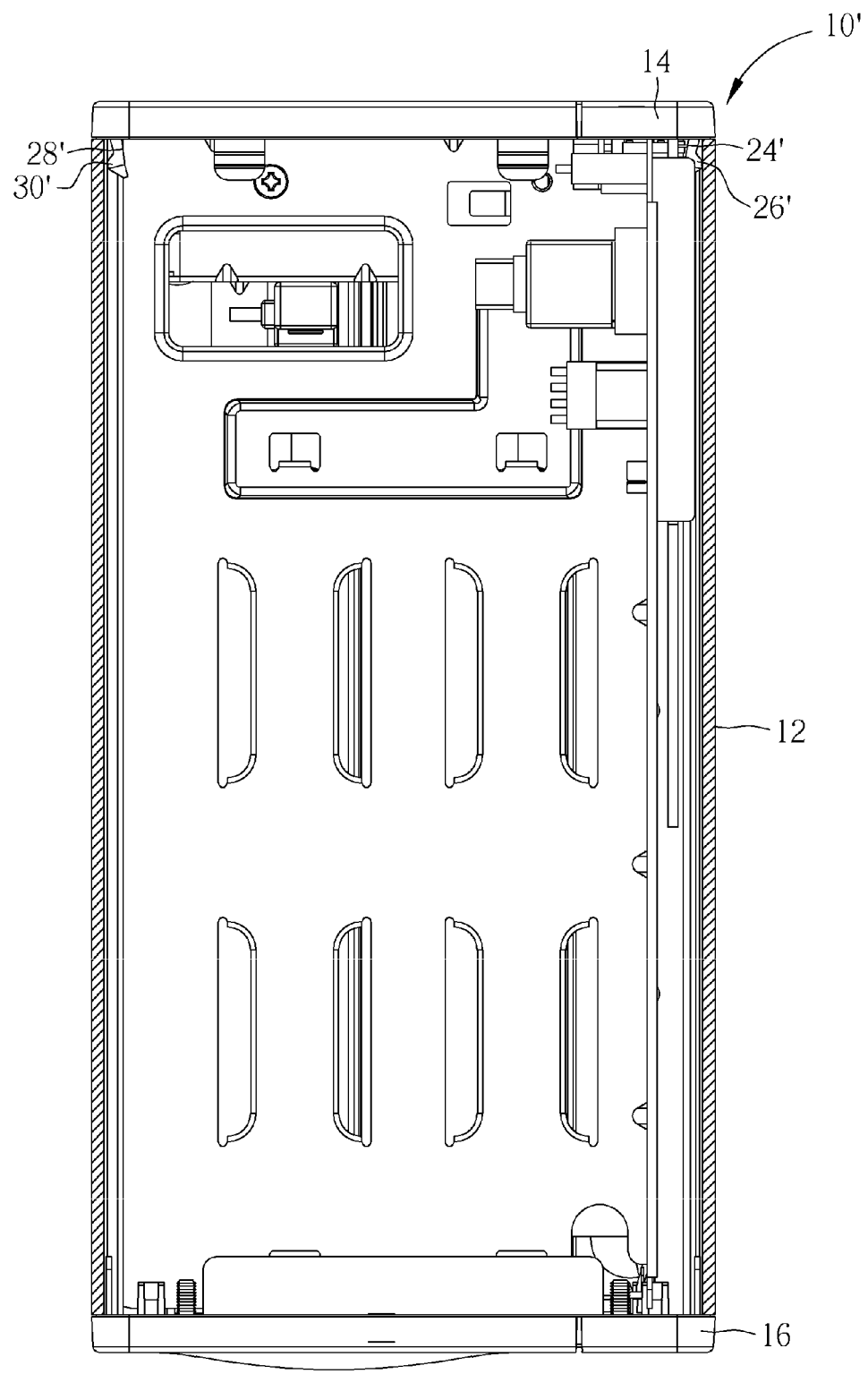
Figure 14:
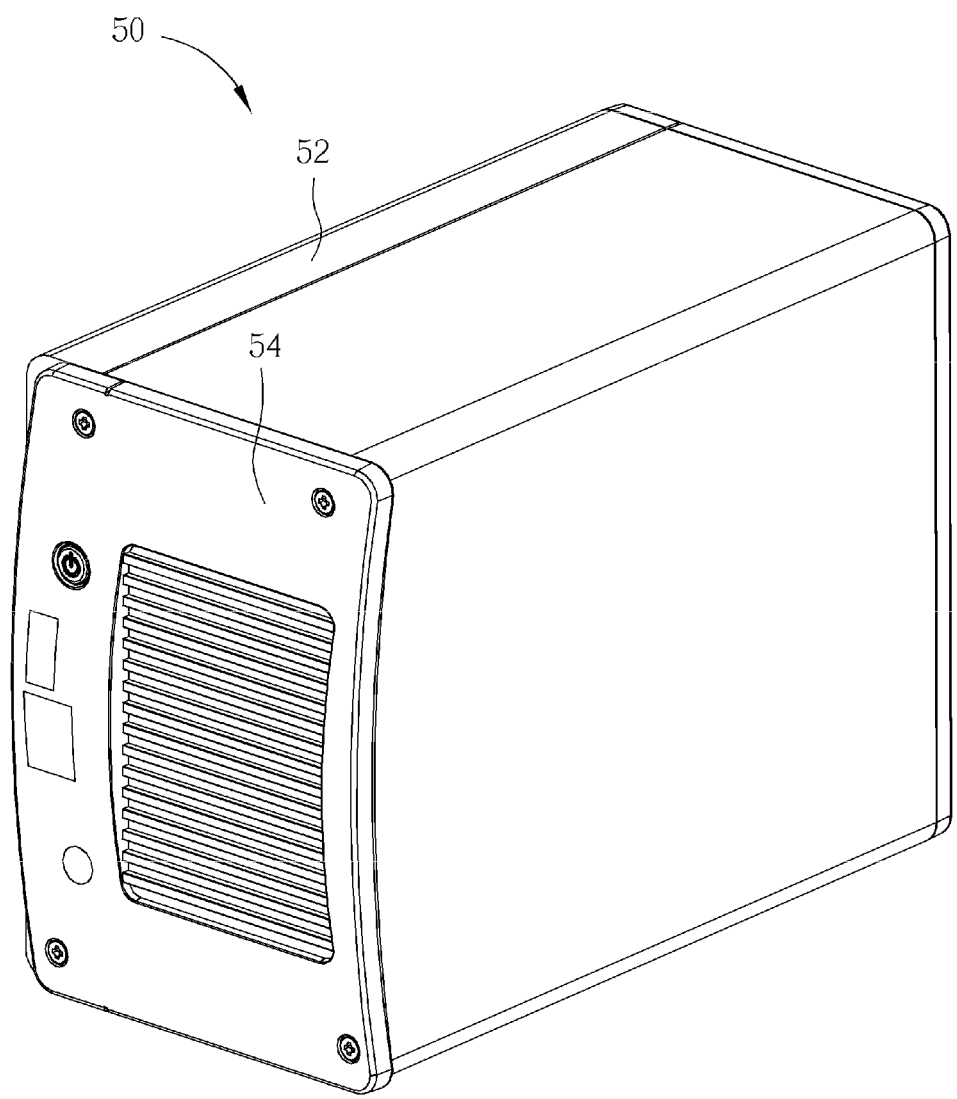
FIG. 14 is a diagram of an apparatus in the prior art.

Please refer to FIG. 12 and FIG. 13. FIG. 12 and FIG. 13 respectively are diagrams of the electronic device 10 in different assembly steps according to the second embodiment of the present invention. As shown in FIG. 12, the panel 14 is spaced from the extrusion casing 12, a distance between the first contact portion 26' and the second contact portion 30' of the positioning mechanism 20 (not shown in FIG. 12 and FIG. 13) can be substantially greater than a width of the opening 121 on the extrusion casing 12, which means each contact portion includes an interference value I relative to the extrusion casing 12. As shown in FIG. 13, the positioning mechanism 20 of the panel 14 completely inserts into the extrusion casing 12. The first contact portion 26' and the second contact portion 30' can tightly contact against the opposite inner surfaces of the extrusion casing 12, and the first rib 24' and the second rib 28' can be bent by the reaction force applied from the extrusion casing 12, so as to execute the positioning function.

For improving assembly accuracy, the interference value I of the first contact portion 26' relative to the extrusion casing 12 can be substantially greater than dimensional variations of the extrusion casing 12 and the panel 14. The dimensional variations may occur during manufacture. The dimensional variation means dimension difference between a final product and a real object of each element (the extrusion casing 12 or the panel 14) in manufacturing procedures. As an amount of the dimensional variations of the extrusion casing 12 and the panel 14 can be smaller than the interference value I, an dimension error of the extrusion casing 12 and the panel 14 due to the manufacturing procedures can be constrained and be within a tolerance range of the position set 22 (not shown in FIG. 12 and FIG. 13). Therefore, the panel 14 of the present invention can utilize the positioning mechanism 20 to automatically align with the non-standard extrusion casing 12 even through the section contour of the extrusion casing 12 does not match the panel 14.

In conclusion, the present invention disposes the positioning mechanism on the panel, and the plurality of position sets of the positioning mechanism is arranged on four sides of the body of the panel in symmetric. Each position set includes two position units, and each position unit includes the rib and the contact portion. The two position units are symmetrically disposed on two opposite sides of the body, so the contact portion contacts against and applies force to the inner surface of the extrusion casing when the panel is assembled with the extrusion casing, and the reaction force applied from the extrusion casing to the contact portion can bend the rib resiliently. Because structures of the two position units are identical to each other, the reaction force applied from the first inner surface of the extrusion casing to the first contact portion can be automatically balanced against the reaction force applied from the second inner surface to the second contact portion when the panel inserts into the opening on the extrusion casing, so that the panel can utilize the positioning mechanism to automatically align with the extrusion casing. After the panel aligns with the extrusion casing, the external fixing component can pierce into the through-hole structure to fix on the extrusion casing, so as to prevent the panel from separating from the extrusion casing. The external fixing component of the present invention does not contact the inner wall of the diameter of the through-hole structure when piercing into the through-hole structure, the external fixing component does not apply a lateral force to the panel, so that the panel is not deformed and does not slope toward the extrusion casing.

Comparing to the prior art, the present invention effectively overcomes drawbacks of uneven contour of the metal casing generated by the extruding procedures. The positioning mechanism of the present invention utilizes dynamic balance to align the panel with the extrusion casing automatically, and has advantages of simple structure, easy assembly and positioning function. Therefore, the panel having the positioning function of the present invention can accurately align the extrusion casing even through the contour dimensions of the extrusion casing can not be manufactured as predetermined values due to parameter variation of the extruding procedures, so as to fabricate the electronic device with the metal texture and preferable structural alignment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A panel having positioning function, the panel comprising:
   a body covering an opening on an extrusion casing, the body comprising a first side, a second side, a third side and a fourth side, the first side being substantially parallel to the second side, and the third side being substantially parallel to the fourth side; and
a positioning mechanism comprising:
at least one position set disposed on the body, the position set comprising:
a first rib, an end portion of the first rib being disposed on the first side of the body;
a first contact portion disposed on the other end portion of the first rib far from the body to outwardly face the first side and contacting against a first inner surface of the extrusion casing in a deformable manner, the first contact portion comprising a first surface only contacting against the first inner surface of the extrusion casing without engagement therebetween and a second surface opposite to the first surface without constraint;
a second rib, an end portion of the second rib being disposed on the second side of the body opposite to the first side, a position of the second rib on the second side being symmetrized to a position of the first rib on the first side; and
a second contact portion disposed on the other end portion of the second rib far from the body to outwardly face the second side and contacting against a second inner surface of the extrusion casing opposite to the first inner surface in the deformable manner, the second contact portion comprising a third surface only contacting against the second inner surface of the extrusion casing without engagement therebetween and a fourth surface opposite to the third surface without constraint, the panel being adjusted to shift relative to the extrusion casing by position difference between the first contact portion and the second contact portion so that sides of the panel aligns with a boundary of the extrusion casing via deformation of the position set; and
wherein the position set is deformed when the panel is assembled with the extrusion casing, a deformation value of a combination of the first contact portion and the first rib is constant, and a deformation value of a combination of the second contact portion and the second rib is constant when the body substantially aligns with the opening;
a through-hole structure disposed on the body, a diameter of the through-hole structure being substantially greater than a diameter of an external fixing component, the external fixing component piercing into the through-hole structure without contacting an inner wall of the diameter of the through-hole structure so as to fix the extrusion casing.

2. The panel of claim 1, wherein the first contact portion is an inclined front part of the first rib.

3. The panel of claim 1, wherein the first contact portion is a protrusion disposed on a front part of the first rib.

4. The panel of claim 3, wherein the position set further comprises a lead angle portion disposed on a surface of the protrusion.

5. The panel of claim 1, wherein the first rib and the second rib are made of resilient material.

6. The panel of claim 1, wherein an interference value of the first contact portion relative to the extrusion casing is substantially greater than an amount of dimensional variations of the extrusion casing and the panel.

7. The panel of claim 1, wherein the first rib does not contact the first inner surface of the extrusion casing.

8. The panel of claim 1, wherein the positioning mechanism further comprises two position sets, the two position sets are respectively disposed on the first side and the second side, or disposed on the third side and the fourth side.

9. The panel of claim 1, wherein the positioning mechanism further comprises two position sets, the two position sets are respectively disposed on the first side and the third side, or disposed on the first side and the fourth side, or disposed on the second side and the third side, or disposed on the second side and the fourth side.

10. An electronic device having positioning function, the electronic device comprising:
an extrusion casing, the extrusion casing comprising a first inner surface and a second inner surface, an opening being formed on a side of the extrusion casing, the first inner surface and the second inner surface being respectively located by two sides of the opening; and
a panel disposed on the extrusion casing, the panel comprising:
a body covering the opening on the extrusion casing, the body comprising a first side, a second side, a third side and a fourth side, the first side being substantially parallel to the second side, and the third side being substantially parallel to the fourth side; and
a positioning mechanism comprising:
at least one position set disposed on the body, the position set comprising:
a first rib, an end portion of the first rib being disposed on the first side of the body;
a first contact portion disposed on the other end portion of the first rib far from the body to outwardly face the first side and contacting against the first inner surface of the extrusion casing in a deformable manner, the first contact portion comprising a first surface only contacting against the first inner surface of the extrusion casing without engagement therebetween and a second surface opposite to the first surface without constraint;
a second rib, an end portion of the second rib being disposed on the second side of the body opposite to the first side, a position of the second rib on the second side being symmetrized to a position of the first rib on the first side; and
a second contact portion disposed on the other end portion of the second rib far from the body to outwardly face the second side and contacting against the second inner surface of the extrusion casing in the deformable manner, the second contact portion comprising a third surface only contacting against the second inner surface of the extrusion casing without engagement therebetween and a fourth surface opposite to the third surface without constraint, the panel being adjusted to shift relative to the extrusion casing by position difference between the first contact portion and the second contact portion so that sides of the panel aligns with a boundary of the extrusion casing via deformation of the position set; and
wherein the position set is deformed when the panel is assembled with the extrusion casing, a deformation value of a combination of the first contact portion and the first rib is constant, and a deformation value of a combination of the second contact portion and the second rib is constant when the body substantially aligns with the opening;

a through-hole structure disposed on the body, a diameter of the through-hole structure being substantially greater than a diameter of an external fixing component, the external fixing component piercing into the through-hole structure without contacting an inner wall of the diameter of the through-hole structure so as to fix the extrusion casing.

11. The electronic device of claim 10, wherein the first contact portion is an inclined front part of the first rib.

12. The electronic device of claim 10, wherein the first contact portion is a protrusion disposed on a front part of the first rib.

13. The electronic device of claim 12, wherein the position set further comprises a lead angle portion disposed on a surface of the protrusion.

14. The electronic device of claim 10, wherein the first rib and the second rib are made of resilient material.

15. The electronic device of claim 10, wherein an interference value of the first contact portion relative to the extrusion casing is substantially greater than an amount of dimensional variations of the extrusion casing and the panel.

16. The electronic device of claim 10, wherein the first rib does not contact the first inner surface of the extrusion casing.

17. The electronic device of claim 10, wherein the positioning mechanism further comprises two position sets, the two position sets are respectively disposed on the first side and the second side, or disposed on the third side and the fourth side.

18. The electronic device of claim 10, wherein the positioning mechanism further comprises two position sets, the two position sets are respectively disposed on the first side and the third side, or disposed on the first side and the fourth side, or disposed on the second side and the third side, or disposed on the second side and the fourth side.

* * * * *